United States Patent
Shim et al.

(10) Patent No.: US 9,521,341 B2
(45) Date of Patent: Dec. 13, 2016

(54) IMAGE SENSORS AND IMAGE CAPTURING APPARATUS INCLUDING THE SAME

(71) Applicant: Samsung Electronics Co., Ltd., Suwon-si, Gyeonggi-do (KR)

(72) Inventors: Eun-sub Shim, Anyang-si (KR); Seung-sik Kim, Hwaseong-si (KR); Kang-sun Lee, Hwaseong-si (KR); Moo-sup Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 14/574,463

(22) Filed: Dec. 18, 2014

(65) Prior Publication Data

US 2015/0195467 A1    Jul. 9, 2015

(30) Foreign Application Priority Data

Jan. 9, 2014 (KR) .................. 10-2014-0003086

(51) Int. Cl.
| | |
|---|---|
| *H04N 5/369* | (2011.01) |
| *H04N 9/04* | (2006.01) |
| *H04N 5/374* | (2011.01) |
| *H01L 27/146* | (2006.01) |

(52) U.S. Cl.
CPC ........ *H04N 5/3696* (2013.01); *H01L 27/1464* (2013.01); *H01L 27/14603* (2013.01); *H01L 27/14621* (2013.01); *H01L 27/14623* (2013.01); *H01L 27/14627* (2013.01); *H04N 5/374* (2013.01); *H04N 9/045* (2013.01)

(58) Field of Classification Search
CPC ...... H04N 5/3696; H04N 9/045; H04N 5/374; H04N 5/2257
See application file for complete search history.

(56) References Cited

U.S. PATENT DOCUMENTS

| | | | |
|---|---|---|---|
| 8,102,433 B2 | 1/2012 | Fujii | |
| 8,269,264 B2 | 9/2012 | Nozaki et al. | |
| 8,319,882 B2 | 11/2012 | Fujii et al. | |
| 8,988,576 B2 * | 3/2015 | Itou | H04N 5/23212 |
| | | | 250/208.1 |

(Continued)

FOREIGN PATENT DOCUMENTS

| | | |
|---|---|---|
| JP | 2009-105358 | 5/2009 |
| JP | 2010-237400 | 10/2010 |
| JP | 2012-168383 | 9/2012 |

*Primary Examiner* — James Hannett
(74) *Attorney, Agent, or Firm* — Myers Bigel, P.A.

(57) ABSTRACT

Provided are an image sensor and an image capturing apparatus including the image sensor. The image sensor includes a pixel array including: multiple sensing pixels outputting image signals respectively corresponding to intensities of incident light; and at least one pair of focusing pixels that are adjacent each other, and each outputting a phase difference of the incident light as a focusing signal; wherein each focusing pixel includes: a semiconductor layer including a photodetecting device accumulating electric charges generated according to absorbed light from among the incident light; a wiring layer formed on a first surface of the semiconductor layer and including wirings; a planarization layer having a first surface on a second surface of the semiconductor layer; a shielding layer formed in the planarization layer to block some of the incident light to be incident to the photodetecting device; and a color filter layer and a micro lens layer.

18 Claims, 13 Drawing Sheets

(56) References Cited

U.S. PATENT DOCUMENTS

| | | |
|---|---|---|
| 2010/0140733 A1 | 6/2010 | Lee et al. |
| 2011/0109776 A1* | 5/2011 | Kawai ............... H01L 27/14625 |
| | | 348/273 |
| 2011/0249156 A1 | 10/2011 | Goto |
| 2011/0273581 A1 | 11/2011 | Fujii et al. |
| 2012/0026372 A1* | 2/2012 | Noguchi ................ G02B 7/282 |
| | | 348/302 |
| 2012/0293706 A1 | 11/2012 | Usui |
| 2013/0070131 A1* | 3/2013 | Ohkubo ............ H01L 27/14623 |
| | | 348/294 |
| 2015/0102442 A1* | 4/2015 | Ootsuka ............. H04N 5/23212 |
| | | 257/432 |
| 2016/0049430 A1* | 2/2016 | Nomura ............ H01L 27/14623 |
| | | 257/432 |

* cited by examiner

IMAGE SENSORS AND IMAGE CAPTURING APPARATUS INCLUDING THE SAME

CROSS-REFERENCE TO RELATED APPLICATIONS

This application claims the benefit of Korean Patent Application No. 10-2014-0003086, filed on Jan. 9, 2014, in the Korean Intellectual Property Office, the disclosure of which is incorporated herein in its entirety by reference.

BACKGROUND

The inventive concept relates to an image sensor and an image capturing apparatus including the image sensor, and more particularly, to an image sensor having a simple structure and which is capable of performing accurate and fast operations and an image capturing apparatus including the image sensor.

Image capturing apparatuses such as a smartphone, a digital camera, etc. are widely used in everyday life. Accordingly, the demand has increased for an image capturing apparatus or an image sensor included in the image capturing apparatus to have high performance. For example, it is necessary for the image capturing apparatus to perform an image capturing operation accurately within a short period of time. Otherwise, since an image capturing apparatus performs various functions, it is necessary to simplify a structure of an image capturing apparatus or an image sensor included in the image capturing apparatus.

SUMMARY

The inventive concept provides an image sensor having a simple structure and which is capable of operating accurately and quickly and an image capturing apparatus including the image sensor.

According to an aspect of the inventive concept, there is provided an image sensor including: a pixel array including: a plurality of sensing pixels configured to output image signals respectively corresponding to intensities of incident light; and at least two focusing pixels that are adjacent to each other, and each outputting a phase difference of the incident light as a focusing signal; wherein each of the at least two focusing pixels includes: a semiconductor layer including a photodetecting device accumulating electric charges generated according to absorbed light from among the incident light; a wiring layer formed on a first surface of the semiconductor layer and including wirings; a planarization layer formed on a second surface of the semiconductor layer and having a first surface; a shielding layer formed in the planarization layer to block some of incident light to be incident to the photodetecting device; and a color filter layer and a micro lens layer formed on a second surface of the planarization layer, wherein the color filter layer selectively transmits the incident light according to a wavelength of the incident light and the micro lens layer selectively focuses the incident light onto the photodetecting device.

Some embodiments of the present inventive concept are directed to an image sensor. In some embodiments, the image sensor may include a pixel array including a plurality of sensing pixels configured to output image signals respectively corresponding to intensities of incident light and at least two focusing pixels that are adjacent one another and are each configured to output a phase difference of the incident light as a focusing signal. Some embodiments provide that each of the at least two focusing pixels includes a semiconductor layer including a photodetecting device accumulating electric charges generated according to absorbed light from among the incident light, a planarization layer formed on a surface of the semiconductor layer and having a first surface on the surface of the semiconductor layer, a shielding layer formed in the planarization layer to block a portion of the incident light to be received by the photodetecting device and a color filter layer formed on a second surface of the planarization layer. In some embodiments, the color filter layer selectively transmits the incident light according to a wavelength of the incident light.

In some embodiments, a portion of the planarization layer is between the shielding layer and the semiconductor layer.

Some embodiments provide that the pixel array is formed to have a Bayer pattern, and the at least two focusing pixels are formed on a red (R) region or a blue (B) region of the Bayer pattern.

In some embodiments, the at least two focusing pixels include a first focusing pixel, a second focusing pixel, a third focusing pixel and a fourth focusing pixel. The first focusing pixel may be adjacent the second focusing pixel and the third focusing pixel may be adjacent the fourth focusing pixel. The shielding layers in the first and second focusing pixels are adjacent one another in a first direction and the shielding layers in the third and fourth focusing pixels are adjacent one another in a second direction that is substantially perpendicular to the first direction.

In some embodiments, the shielding layers in the first and second focusing pixels are spaced apart from one another in a first direction and the shielding layers in the third and fourth focusing pixels are spaced apart from one another in a second direction that is substantially perpendicular to the first direction.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION OF THE EMBODIMENTS

Figure 1:
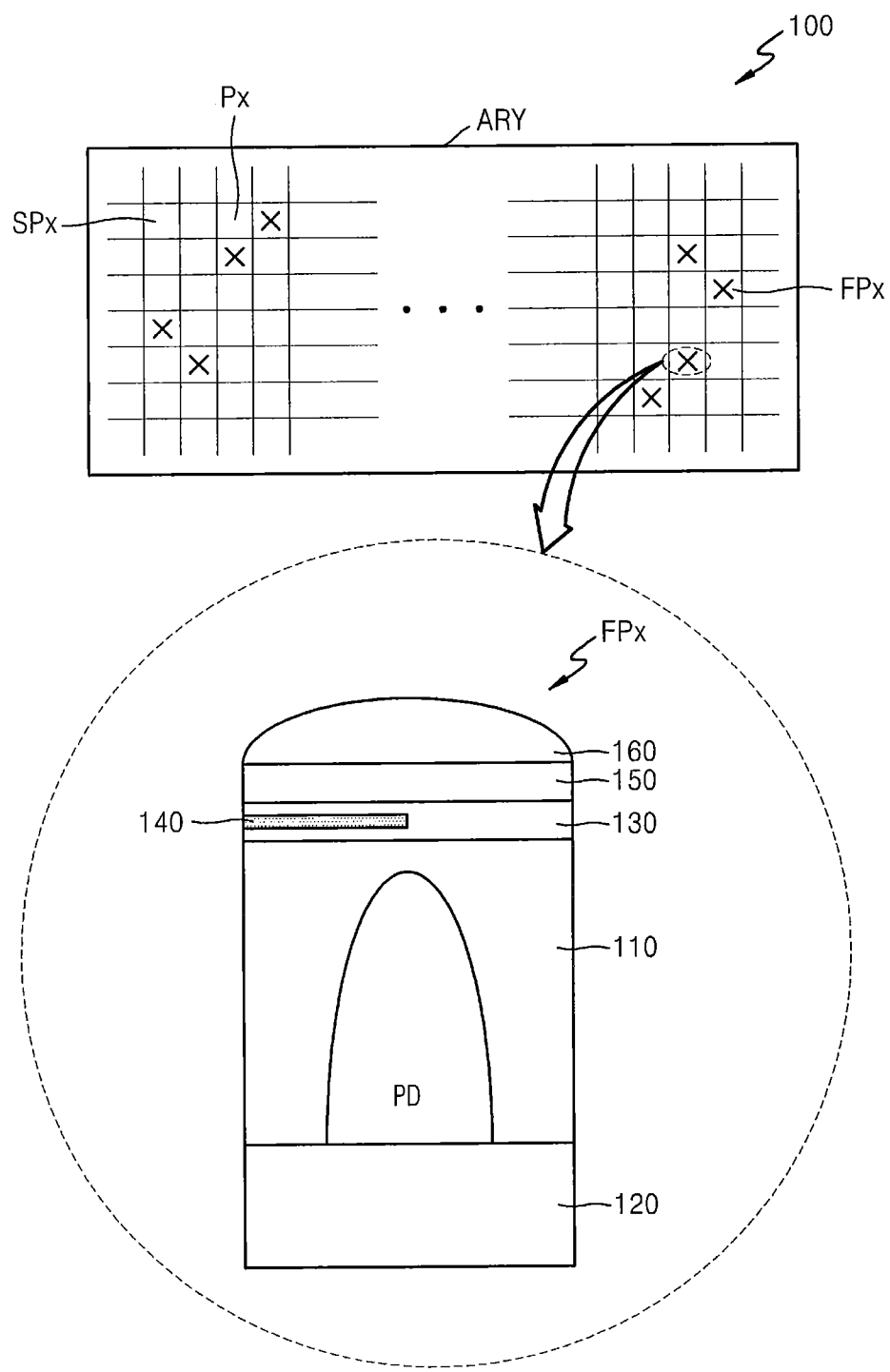
FIG. 1 is a diagram showing an image sensor according to some embodiments of the present inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

It should be construed that forgoing general illustrations and following detailed descriptions are exemplified and an additional explanation of claimed inventive concepts is provided.

Reference numerals are indicated in detail in some embodiments of the present inventive concept, and their examples are represented in reference drawings. Throughout the drawings, like reference numerals are used for referring to the same or similar elements in the description and drawings.

FIG. 1 is a diagram showing an image sensor 100 according to some embodiments of the present inventive concept. Referring to FIG. 1, the image sensor 100 of the present embodiment includes a pixel array ARY including a plurality of pixels Px arranged in a two-dimensional matrix. Some embodiments provide that the image sensor 100 may be a complementary metal oxide semiconductor (CMOS) type image sensor (CIS), however, such embodiments are non-limiting. The CIS controls a control device that controls and/or processes optical signals in an image sensor by using a CMOS manufacturing technology, and thus, may be manufactured in a simple way and may be fabricated as a chip having a plurality of signal processing devices. In some embodiments, the image sensor 100 may be a backside illumination (BSI) image sensor. The BSI image sensor includes a wiring layer 120, which will be described later, located under a photodetecting device (PD) of a semiconductor layer 110 and in an incident direction of light, and thus, may sense incident light accurately.

Referring to FIG. 1, each of the pixels Px in the pixel array ARY may be one of a sensing pixel SPx or a focusing pixel FPx. That is, the image sensor 100 according to some embodiments is an image sensor performing both image sensing and auto focusing via one pixel array ARY. Each of the sensing pixels SPx senses light intensity of incident light and outputs an image signal corresponding to the light intensity. The image signal is used to form an image of the corresponding sensing pixel SPx. The sensing pixel SPx will be described in detail later.

Each of the focusing pixels FPx may output a focusing signal corresponding to a phase difference with the light incident to an adjacent focusing pixel FPx. The focusing signal may be used to adjust a location of a lens of an image capturing apparatus including the image sensor 100, in order to perform the auto focusing function. The number of focusing pixels FPx may be less than that of the sensing pixels SPx. The focusing pixels FPx may be arranged randomly and/or regularly with respect to the locations and the number of the sensing pixels SPx.

FIG. 1 shows a conceptual cross-sectional view of the focusing pixel FPx. The focusing pixel FPx according to some embodiments may include the semiconductor layer 110, the wiring layer 120, a planarization layer 130, a shielding layer 140, a color filter layer 150, and a micro lens layer 160. The semiconductor layer 110 may be, for example, one of a bulk substrate, an epitaxial substrate, and/or a silicon-on-insulator (SOI) substrate.

The semiconductor layer 110 may include a photo detecting device PD. The photodetecting device PD may be a photodiode, and the photodiode may absorb light incident through the micro lens layer 160, the color filter layer 150, and the planarization layer 130 to generate electric current. If a charge transfer path between the photodetecting device PD and the outside is blocked while the photodetecting device PD absorbs light, electric charges of the current generated by the photodetecting device PD may be accumulated in the photodetecting device PD. Since the electric charge accumulated in the photodetecting device PD increases according to an intensity of light absorbed by the photodetecting device PD, an intensity of light absorbed by the photodetecting device PD may be sensed according to the amount of electric charges accumulated in the photodetecting device PD. Although not shown in FIG. 1, the semiconductor layer 110 may further include one or more transistors for sensing the electric charges accumulated in the photodetecting device PD as an electric signal or resetting the electric charges accumulated in the photodetecting device PD by the focusing pixel FPx.

The wiring layer 120 contacts a surface of the semiconductor layer 110, and may include a plurality of wirings formed of a conductive material. The electric charges accumulated in the photodetecting device PD may be output to the outside via the wiring layer 120. The planarization layer 130, the color filter layer 150, and the micro lens layer 160 may be sequentially stacked on the other surface of the semiconductor layer 110. The planarization layer 130 may include the shielding layer 140. The shielding layer 140 is disposed to block some of the light transmitted to the photodetecting device PD, as will be described later, and thus, may have a cross-sectional area that is less than that of the focusing pixel FPx, for example, the semiconductor layer 110. Accordingly, the shielding layer 140 may generate a step.

The planarization layer 130 may be formed to a predetermined thickness between the semiconductor layer 110 and the color filter layer 150 in order to prevent generation of the step due to the shielding layer 140. The micro lens layer 160 may focus the incident light toward the photodetecting device PD. The color filter layer 150 transmits the light incident through the micro lens layer 160 so that light of a necessary wavelength may be incident to the photodetecting device PD.

The shielding layer 140 may be formed in the planarization layer 130 that is formed between the color filter layer 150 and the semiconductor layer 110, in order to prevent some of the light incident to the planarization layer 130 via the micro lens layer 160 and the color filter layer 150 from being transmitted to the photodetecting device PD. Here, the shielding layer 140 may be formed above a surface of the planarization layer 130 to be separated therefrom. Otherwise, the shielding layer 140 may be formed in contact with the surface of the planarization layer 130.

A part of the light incident to the planarization layer 130 after passing through the micro lens layer 160 and the color filter layer 150 is incident to the semiconductor layer 110 via the planarization layer 130, and another part of the light incident to the planarization layer 130 after passing through the micro lens layer 160 and the color filter layer 150 may be blocked by the shielding layer 140 included in the planarization layer 130 and may not be incident to the semiconductor layer 110. The shielding layer 140 may include a material that does not transmit light, for example, metal.

In the BSI type image sensor including the focusing pixels FPx and the sensing pixels SPx in the same pixel array, the shielding layer may be located in an optimal location between the semiconductor layer 110 and the color filter layer 150, and thus, an accurate auto focusing function may be performed with the image sensor having a simple structure.

Figure 2:
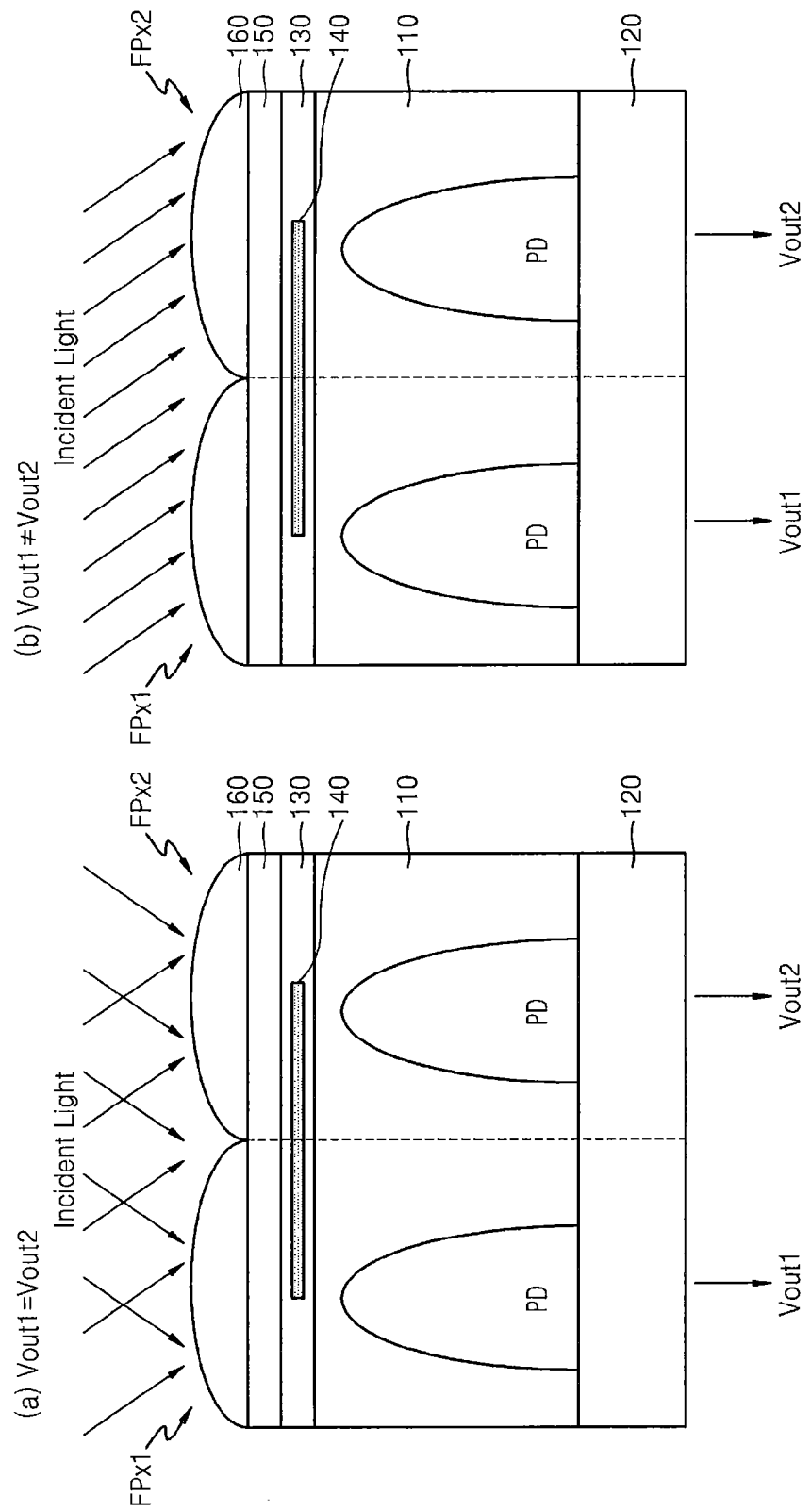
FIG. 2 is a diagram illustrating performance of a shielding layer included in a focusing pixel of FIG. 1.

FIG. 2 is a diagram illustrating functions of the shielding layer in the focusing pixel FPx of FIG. 1. FIG. 2 shows a first focusing pixel FPx1 and a second focusing pixel FPx2 that are adjacent one another in order to describe the function of the focusing pixel FPx. Referring to (a) of FIG. 2, in a case where a subject is focused by a lens of an imaging apparatus including the image sensor 100, a phase of light incident to the image sensor 100 is constant, and thus, even if some of the light is blocked by the shielding layer 140, intensities of light absorbed by the respective photodetecting devices PD of the first focusing pixel FPx1 and the second focusing pixel FPx2 may be equal to each other. Therefore, electric signals output from the first focusing pixel FPx1 and the second focusing pixel FPx2, for example, a first output voltage Vout1 and a second output voltage Vout2, may be equal to each other.

Referring to (b) of FIG. 2, in a case where the subject is focused by the lens of the imaging apparatus including the image sensor 100, a phase difference of the light incident to the image sensor 100 is generated, and thus, intensities of the light absorbed by the respective photodetecting devices PD of the first focusing pixel FPx1 and the second focusing pixel FPx2 may be different due to the shielding layer 140. Therefore, the respective electric signals output from the first focusing pixel FPx1 and the second focusing pixel FPx2, for example, the first output voltage Vout1 and the second output voltage Vout2, may be different from each other.

Figure 3:
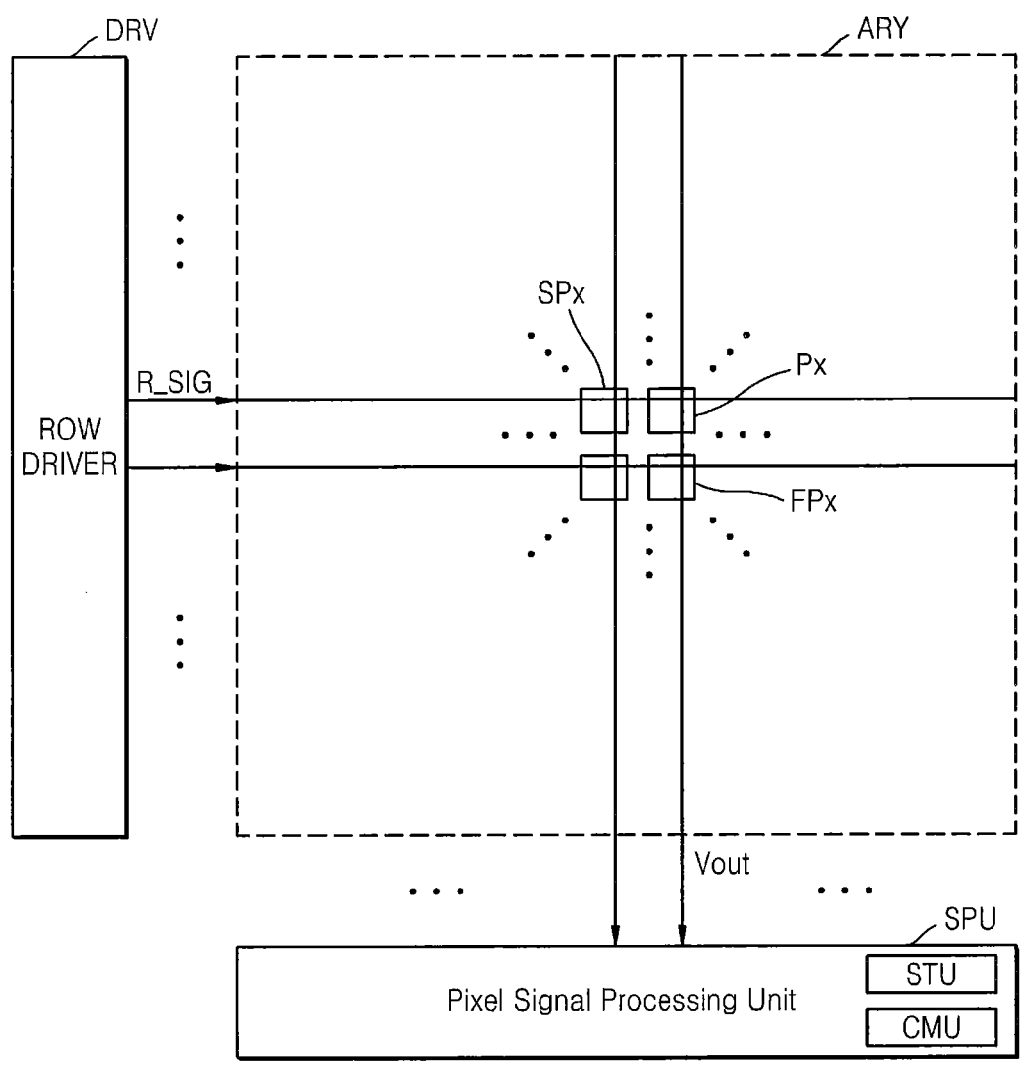
FIG. 3 is a diagram of an image sensor including a pixel array of FIG. 1 in detail.

FIG. 3 is a diagram showing the image sensor 100 including the pixel array ARY of FIG. 1 in more detail. The image sensor 100 may include the pixel array ARY, a row driver DRV, and a pixel signal processing unit SPU. The pixel array ARY may include a plurality of pixels Px. The row driver DRV may output a row signal R_SIG, and the row signal R_SIG may be input to the pixel array ARY. The row signal R_SIG may include a plurality of signals, and the plurality of signals may respectively control the pixels Px included in the pixel array ARY.

The pixel signal processing unit SPU may receive an output voltage Vout output from at least one pixel Px included in the pixel array ARY, and may measure a magnitude of the output voltage Vout. A plurality of pixels Px that designate columns may share one row signal R_SIG, and a plurality of pixels Px that designate rows may share a signal line through which the output voltage Vout is output.

As described above, the pixel array ARY according to some embodiments may include the sensing pixel SPx and the focusing pixel FPx. The pixel signal processing unit SPU may store location information about a location of the focusing pixel FPx. To do this, the pixel signal processing unit SPU may include a storage unit STU. In addition, the pixel signal processing unit SPU may include a comparing unit CMU that is configured to generate a result of comparing the output voltages Vout from the adjacent focusing pixels FPx based on the location information. For example, the comparing unit CMU may output a result of comparing a first output voltage Vout1 and a second output voltage Vout2 from the first focusing pixel FPx1 and the second focusing pixel FPx2 of FIG. 2. The comparison result may be used by logic of the imaging apparatus including the image sensor 100 to perform the auto focusing function.

However, embodiments of the present inventive concept are not limited thereto. The pixel signal processing unit SPU may output the output voltage Vout of the sensing pixel SPx and the focusing pixel FPx, and logic of the imaging apparatus including the image sensor 100 may compare the first output voltage Vout1 and the second output voltage Vout2 from the first and second focusing pixels FPx1 and FPx2 shown in FIG. 2.

Figure 4:
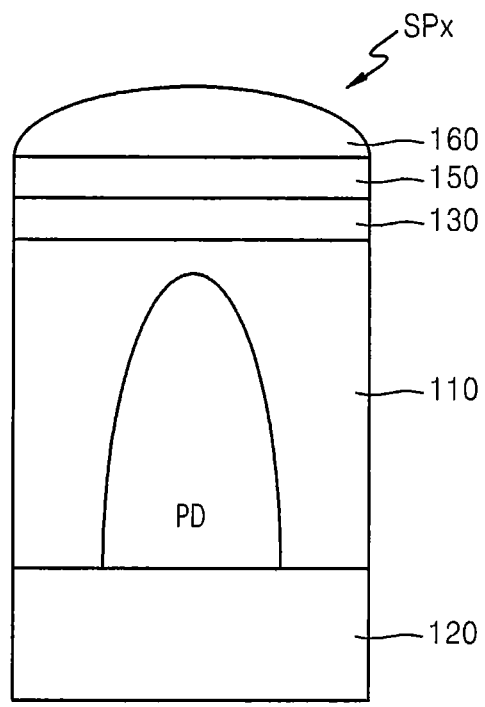
FIG. 4 is a diagram showing an example of a sensing pixel of FIG. 1.

FIG. 4 is a diagram showing an example of the sensing pixel SPx of FIG. 1. Referring to FIG. 4, the sensing pixel SPx may include the semiconductor layer 110, the wiring layer 120, the planarization layer 130, the color filter layer 150, and the micro lens layer 160. As described above, since the sensing pixel SPx and the focusing pixel FPx are included in the same pixel array ARY, the semiconductor layer 110, the wiring layer 120, the planarization layer 130, the color filter layer 150, and the micro lens layer 160 of the sensing pixel SPx may be formed of the same material and/or formed to have the same size as those of the focusing pixel FPx. Therefore, detailed descriptions of the layers included in the sensing pixel SPx of FIG. 4 are not provided here. However, the sensing pixel SPx may operate to sense the incident amount of light exactly, and thus, unlike the focusing pixel FPx, the sensing pixel SPx may not include the shielding layer 140.

Figure 5A:
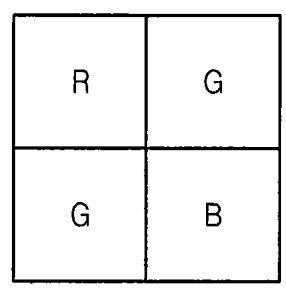
FIGS. 5A and 5B are diagrams showing an example of a pattern of pixels in the pixel array of FIG. 1.
Figure 5B:
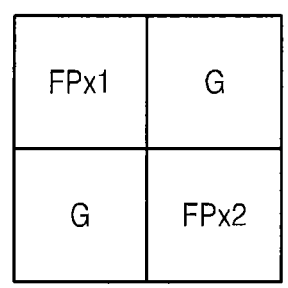

FIGS. 5A and 5B are diagrams showing examples of a pixel pattern in the pixel array of FIG. 1. Referring to FIG. 1 and FIG. 5A, each of the pixels Px in the pixel array ARY may be arranged in a Bayer pattern that includes twice as many green (G) filters than red (R) filters and blue (B) filters in the color filter layer 150. However, the embodiments of the present inventive concept are not limited thereto. Each of the pixels Px in the pixel array ARY according to the embodiment of the present inventive concept may be arranged in a non-Bayer pattern. However, it will be assumed that each of the pixels Px in the pixel array ARY is formed to be arranged in a Bayer pattern for convenience of description.

Referring to FIGS. 1 and 5B, in the pixel array ARY in which pixels Px are arranged in the Bayer pattern, the focusing pixel FPx may be disposed on an R region or a B region. For example, in a layer pattern of RGGB, the first focusing pixel FPx1 may be disposed on an R region, and the second focusing pixel FPx2 may be disposed on a B region. As described above, the auto focusing function may be performed based on a difference between the output voltages from at least a pair of focusing pixels FPx that are adjacent one another. Since human eyes are sensitive to a brightness difference, the focusing pixels FPx are disposed on the R region or the B region that is related to color, rather than a G region that is related to brightness. Thus, affects of the focusing pixels FPx on the image sensing may be reduced in the pixel array ARY including the sensing pixels SPx and the focusing pixels FPx. However, according to an issue such as a layout in the image sensor and/or an electronic device including the image sensor, the focusing pixels FPx may be disposed on the G region, not the R region or the B region.

Figure 6A:
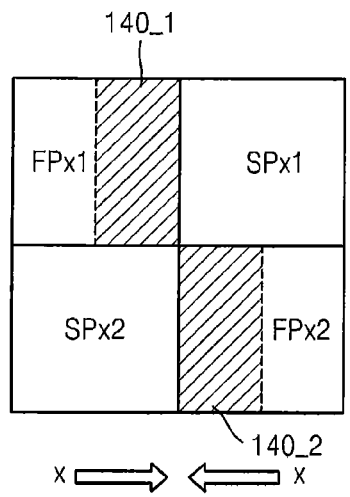
FIGS. 6A and 6B are diagrams showing examples of locations of the shielding layers included in two adjacent focusing pixels arranged as shown in FIG. 5B in which shielding layers in the first and second focusing pixels and may be disposed in adjacent directions.
Figure 6B:
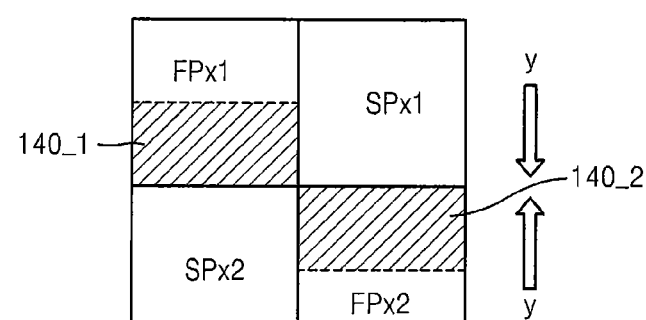

FIGS. 6A through 8B are diagrams showing examples of locations of the shielding layers included in two adjacent focusing pixels arranged as shown in FIG. 5B. In FIGS. 6A through 8B, a material deposited on the shielding layer of the focusing pixel is not shown in order to clarify the location of the shielding layer. Referring to FIGS. 6A and 6B, shielding layers 140_1 and 140_2 in the first and second focusing pixels FPx1 and FPx2 may be disposed in adjacent directions. For example, as shown in FIG. 6A, the shielding layer 140_1 of the first focusing pixel FPx1 and the shielding layer 140_2 of the second focusing pixel FPx2 may be disposed on regions adjacent one another in a first direction in respective focusing pixels FPx1 and FPx2. Otherwise, as shown in FIG. 6B, the shielding layer 140_1 of the first focusing pixel FPx1 and the shielding layer 140_2 of the second focusing pixel FPx2 may be disposed in regions adjacent one another in a second direction (y) in respective focusing pixels FPx1 and FPx2.

Figure 7A:
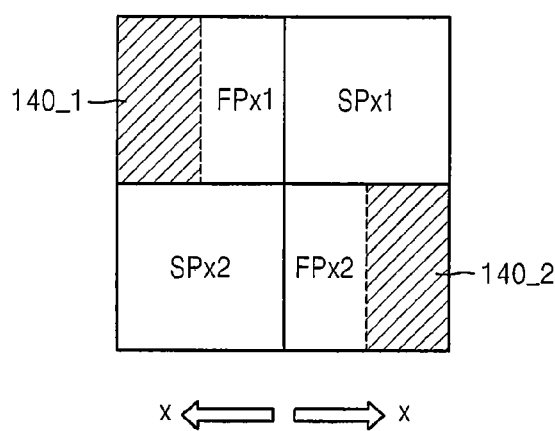
FIGS. 7A and 7B are diagrams showing examples of locations of the shielding layers included in two adjacent focusing pixels arranged as shown in FIG. 5B in which the shielding layers of the first and second focusing pixels may be disposed to be spaced apart from each other.
Figure 7B:
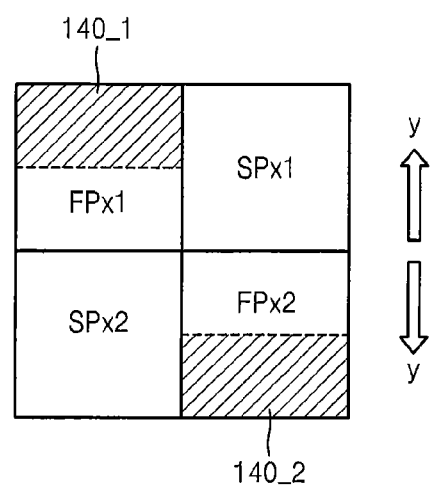

Next, referring to FIGS. 7A and 7B, the shielding layers 140_1 and 140_2 of the first and second focusing pixels FPx1 and FPx2 may be disposed to be spaced apart from each other. For example, as shown in FIG. 7A, the shielding layer 140_1 of the first focusing pixel FPx1 and the shielding layer 140_2 of the second focusing pixel FPx2 may be disposed on regions that are spaced apart from each other in the first direction (x) in respective focusing pixels FPx1 and FPx2. Otherwise, as shown in FIG. 7B, the shielding layer 140_1 of the first focusing pixel FPx1 and the shielding layer 140_2 of the second focusing pixel FPx2 may be disposed in regions that are spaced apart from each other in the second direction (y) in respective focusing pixels FPx1 and FPx2.

Figure 8A:
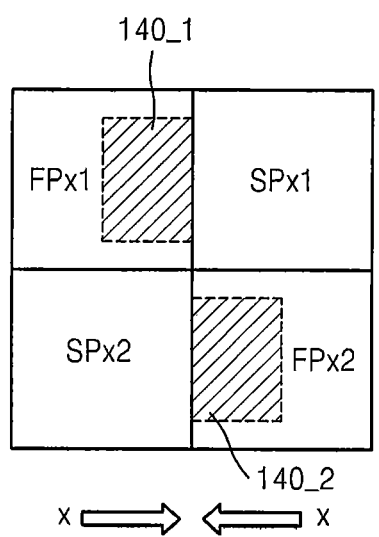
FIGS. 8A and 8B are diagrams showing examples of locations of the shielding layers included in two adjacent focusing pixels arranged as shown in FIG. 5B in which the shielding layers of the first and second focusing pixels may have lengths shorter than that of the side of the focusing pixels.
Figure 8B:
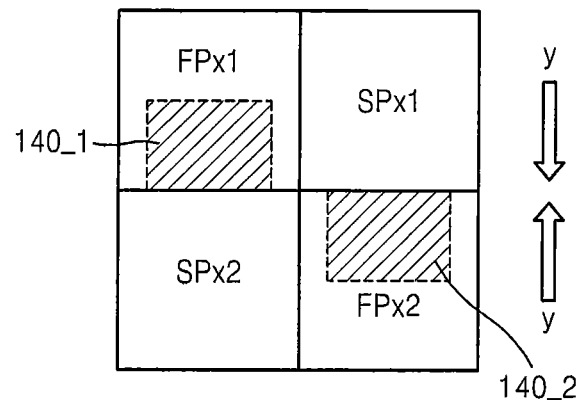

FIGS. 6A through 7B show examples in which the shielding layer 140_1 of the first focusing pixel FPx1 and the shielding layer 140_2 of the second focusing pixel FPx2 are formed to have the same lengths as that of a side of the focusing pixel. However, the embodiments of the present inventive concept are not limited thereto. Referring to FIGS. 8A and 8B, the shielding layers 140_1 and 140_2 of the first and second focusing pixels FPx1 and FPx2 may have lengths shorter than that of the side of the focusing pixels.

FIGS. 9A through 9E are diagrams illustrating methods of manufacturing an image sensor according to some embodiments of the present inventive concept. As illustrated with reference to FIG. 1, the focusing pixel FPx may include the semiconductor layer 110, the wiring layer 120, the planarization layer 130, the shielding layer 140, the color filter layer 150, and the micro lens layer 160. According to some embodiments, a unit pixel may be formed by stacking layers in an order of the semiconductor layer 110, the wiring layer 120, the shielding layer 140, the planarization layer 130, the color filter layer 150, and the micro lens layer 160. This will be described below. However, descriptions about manufacturing transistors that perform functions such as sensing of the electric charges accumulated in the photodetecting device PD in the focusing pixel FPx as electric signals and/or resetting of the electric charges accumulated in the photodetecting device PD are omitted here.

Figure 9A:
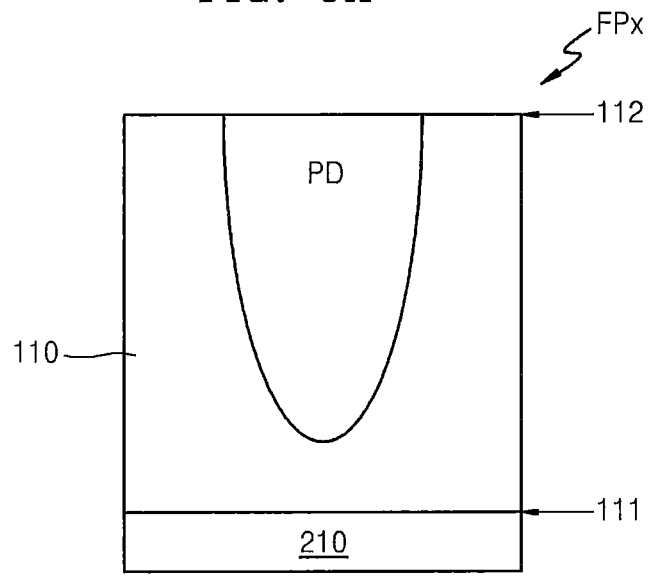
FIGS. 9A through 9E are diagrams illustrating methods of manufacturing an image sensor according to some embodiments of the present inventive concept.

First, referring to FIG. 9A, the semiconductor layer 110 is formed on a first support substrate 210. The semiconductor layer 110 may be one of a bulk substrate, an epitaxial substrate, and/or an SOI substrate. A surface of the semiconductor layer 110 contacting the first support substrate 210 is referred to as a first surface 111 of the semiconductor layer 110, and a surface opposite to the first surface 111 of the semiconductor layer 110 is referred to as a second surface 112. The photodetecting device PD may be formed by injecting impurities toward the second surface of the semiconductor layer 110.

Figure 9B:
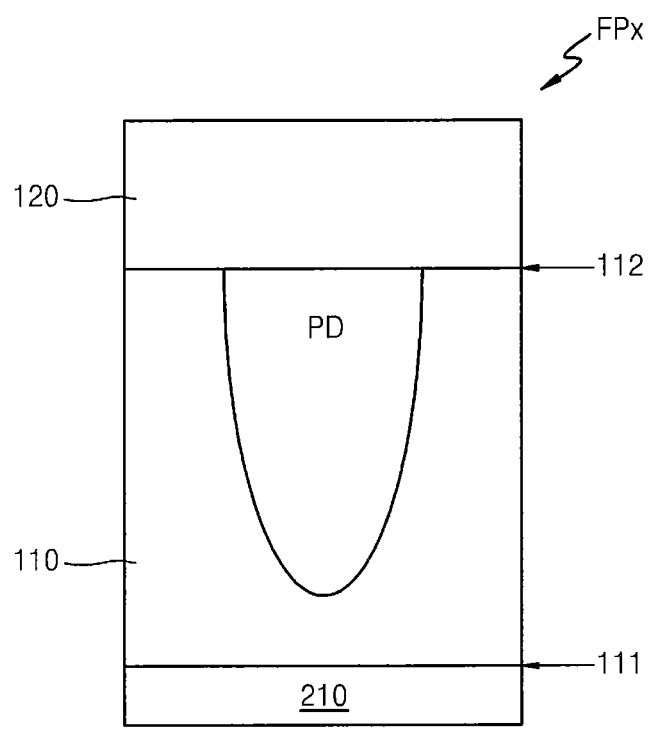

Referring to FIG. 9B, the wiring layer 120 may be formed on the second surface 112 of the semiconductor layer 110. The wiring layer 120 may have a structure in which wirings and interlayer insulating layers are stacked. Wirings in the wiring layer 120 may be formed through processes such as a patterning, a masking, an etching, etc. The wiring may be formed of a conductive material, for example, a metal material and/or an alloy layer in which at least two kinds of metals are mixed. The interlayer insulating layer may be formed of an insulating material, for example, silicon oxide. The forming of the wiring and the forming of the interlayer insulating layer may be repeatedly performed to form multiple wirings.

Figure 9C:
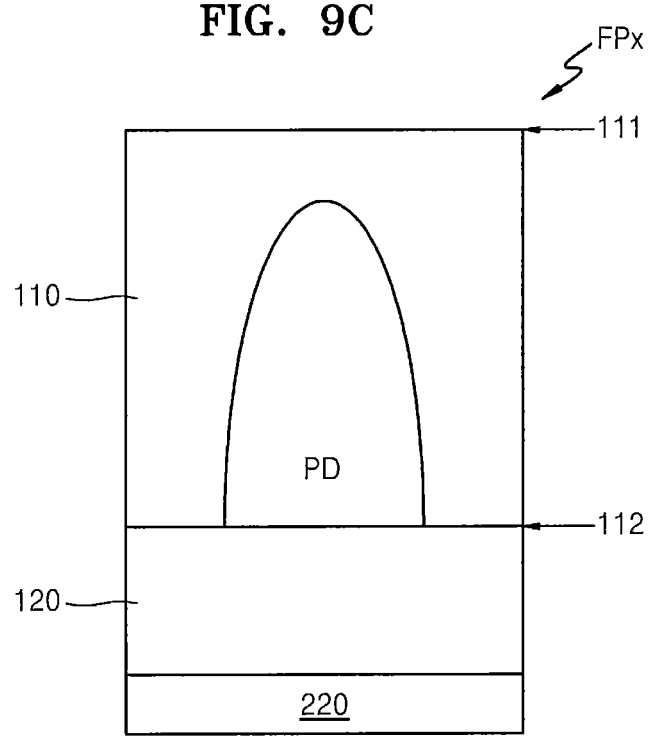

Referring to FIGS. 9B and 9C, a second support substrate 220 is attached to the wiring layer 120 to support a surface of the wiring layer 120. After that, a multiple-layered structure including the first support substrate 210 and the second support substrate 220 is turned upside down so that the first support substrate 210 may be located above the second support substrate 220, and then, the first support substrate 210 may be removed. For example, the first support substrate 210 may be ground to a thickness of tens of μm by a grinder, and any remaining parts of the first support substrate 210 may be removed by an etching process.

Figure 9D:
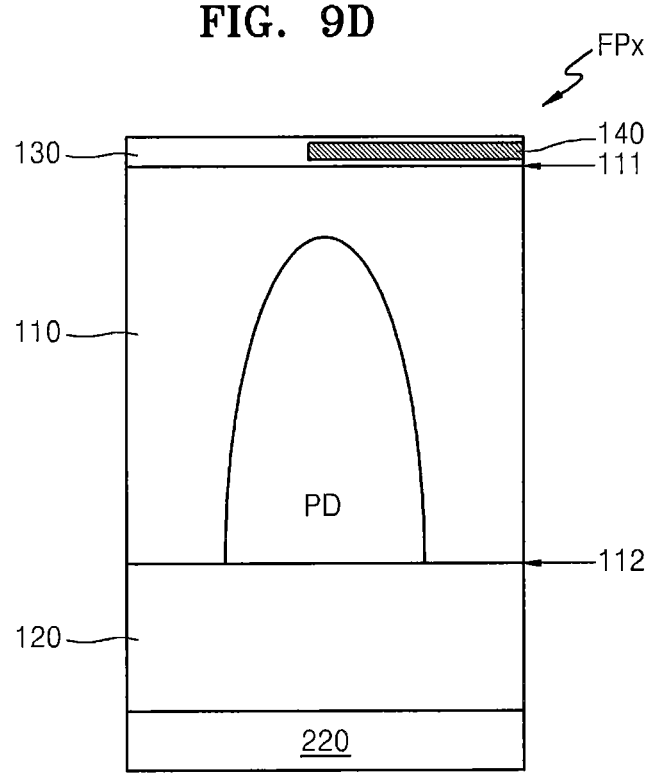

Referring to FIG. 9D, the planarization layer 130 may be formed on the second surface 112 of the semiconductor layer 110. The shielding layer 140 is formed in the planarization layer 130. The shielding layer 140 may be formed through processes such as a patterning, a masking, and/or an etching process. After forming the shielding layer 140, a predetermined material may be injected to form the planarization layer 130. Otherwise, the shielding layer 140 may be formed by injecting a predetermined material in the planarization layer 130 after forming the planarization layer 130. As described above, the shielding layer 140 blocks some of the light incident to the semiconductor layer 110 so that a portion of the semiconductor layer 110 does not absorb the light. The shielding layer 140 may include a material that does not transmit light, for example, metal.

Figure 9E:
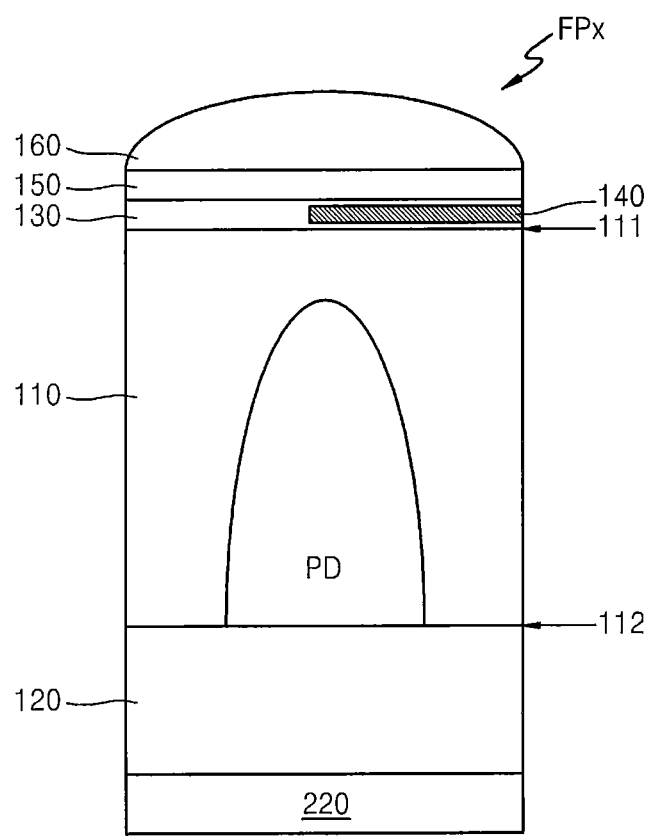

Referring to FIG. 9E, the color filter layer 150 may be formed on the planarization layer 130. After that, the micro lens layer 160 may be formed on the color filter layer 150. The micro lens layer 160 may focus the light onto the photodetecting device PD of the focusing pixel Px. The color filter layer 150 may transmit the light of a necessary wavelength from among the light incident through the micro lens layer 160. After forming the micro lens layer 160, a residual material on the surface of the micro lens layer 160 may be formed. Also, a baking process may be performed to maintain a shape of the micro lens layer 160.

The focusing pixel Px manufactured through the processes shown in FIGS. 9A through 9E according to some embodiments may optimize the location of the shielding layer so as to simplify the structure and to perform an auto focusing accurately, in a BSI type image sensor including the pixel array that includes both the focusing pixels and the sensing pixels. FIGS. 9A through 9E show the processes of manufacturing the focusing pixel FPx; however, as described above, when manufacturing the pixel array ARY of the image sensor 100, the focusing pixels FPx and the sensing pixels SPx may be manufactured through simultaneous processes. Therefore, the sensing pixel SPx of FIG. 4 may be formed through the same processes as those of FIGS. 9A through 9E, except for the process of forming the shielding layer 140.

Figure 10B:
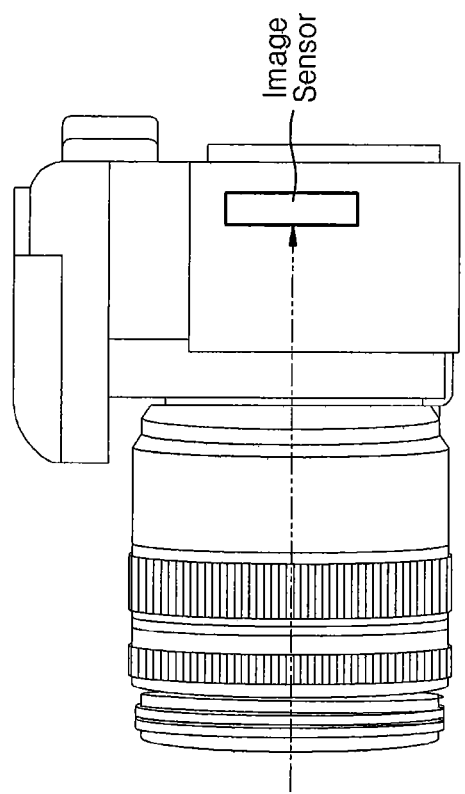
FIGS. 10A and 10B are diagrams showing examples of a camera including an image sensor according to some embodiments described herein.
Figure 10A:
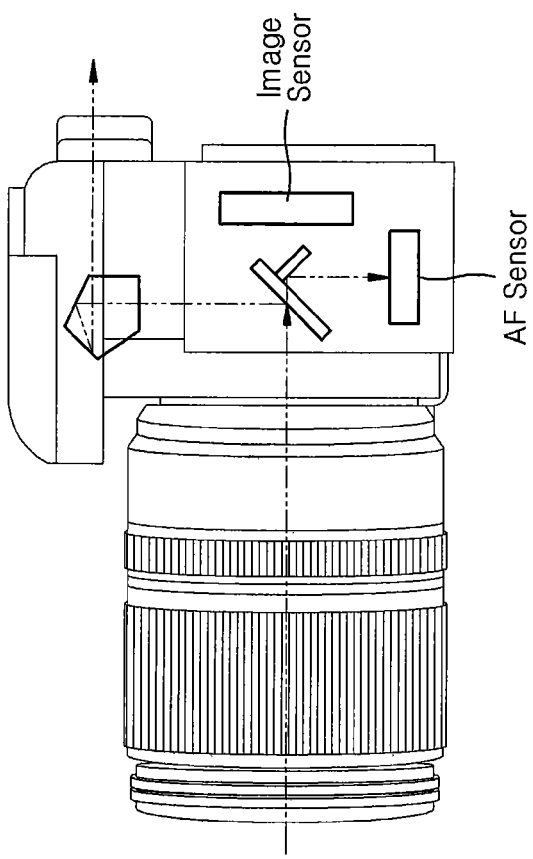

FIGS. 10A and 10B are diagrams showing examples of a camera including an image sensor according to some embodiments described herein. Referring to FIGS. 1 and 10A and 10B, the image sensor 100 according to some embodiments may be included in an image capturing apparatus. For example, the image sensor 100 may be included in a digital camera. In the image capturing apparatus according to some embodiments of the present inventive concept, unlike a camera including an additional auto focusing (AF) sensor for performing an auto focusing operation (FIG. 10A), the sensing pixels SPx and the focusing pixels FPx are included in the pixel array ARY of the image sensor 100 (FIG. 10B). Therefore, the camera including the image sensor 100 according to embodiments herein may not include an additional AF sensor, as shown in FIG. 10B.

The camera of FIG. 10B receives the light incident through a lens, and may control an actuator of the lens based on a difference between output voltages from at least a pair of focusing pixels FPx in the image sensor 100. In the camera of FIG. 10A including an AF sensor in addition to the image sensor, some of the light transmitted through the lens of the camera may be incident to at least two AF sensors so that an actuator of the lens may be controlled based on a difference between phases of the light incident to the AF sensors.

Figure 11:
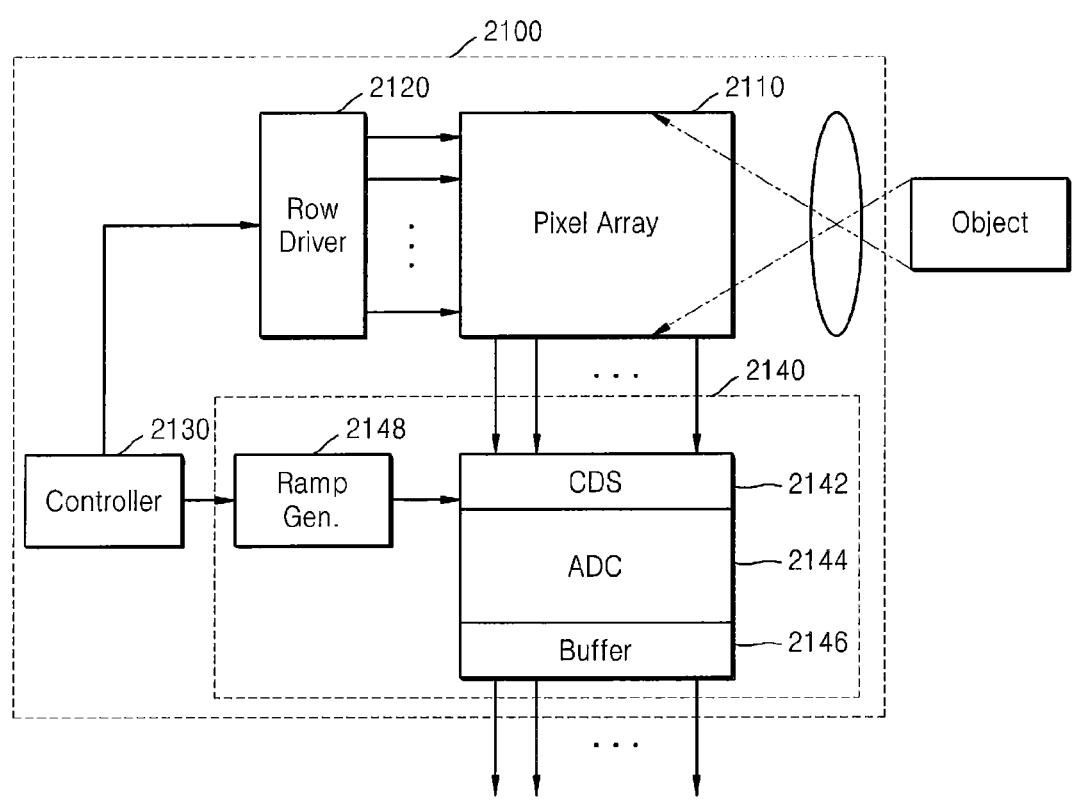
FIG. 11 is a block diagram of an image sensor chip according to some embodiments of the present inventive concept.

FIG. 11 is a block diagram of an image sensor chip 2100 according to some embodiments of the present inventive concept. As shown in FIG. 11, the image sensor chip 2100 may include a pixel array 2110, a controller 2130, a row driver 2120, and a pixel signal processing unit 2140. The pixel array 2110 may include a plurality of pixels that are arranged two-dimensionally like the pixel array ARY shown in FIG. 1, and each of the pixels may include a photodetecting device. The photodetecting device absorbs light to generate electric charges, and electric signals (output voltages) according to the generated electric charges may be provided to the pixel signal processing unit 2140 via a vertical signal line. The pixels included in the pixel array 2110 may provide one output voltage at a time by a row unit, and accordingly, the pixels included in a row of the pixel array 2110 may be simultaneously activated according to a selection signal output from the row driver 2120. The pixels included in a selected row may provide the output voltage according to the absorbed light intensity to an output line of a corresponding column.

The pixel array 2110 may include the sensing pixels SPx and the focusing pixels FPx like in the pixel array ARY of FIG. 1. Here, each of the focusing pixels FPx includes the shielding layer 140 in the planarization layer 130 between the semiconductor layer 110 and the color filter layer 150, and thus, may output an accurate output voltage according to the phase difference of the light even in the BSI image sensor.

The controller 2130 may control the row driver 2120 so that the pixel array 2110 absorbs the light and accumulates the electric charges and/or outputs the electric signals according to the accumulated electric charges to the outside of the pixel array 2110. Also, the controller 2130 may control the pixel signal processing unit 2140 to measure an output voltage provided by the pixel array 2110.

The pixel signal processing unit 2140 may include a correlated double sampler (CDS) 2142, an analog-digital converter (ADC) 2144, and a buffer 2146. The CDS 2142 may sample and hold the output voltage provided by the pixel array 2110. The CDS 2142 may perform a double sampling at a certain noise level and a level according to the output voltage so as to output a level corresponding to a difference between the noise level and the level according to the output voltage. Also, the CDS 2142 may receive lamp signals generated by a lamp signal generator 2148, and then, compare the lamp signals and output a comparison result.

The ADC 2144 may convert an analog signal corresponding to the level transmitted from the CDS 2142 into a digital signal. The buffer 2146 may store the digital signal, and the stored digital signal may be output to the outside of the image sensor chip 2100 to be transmitted to an image processor (not shown).

Figure 12:
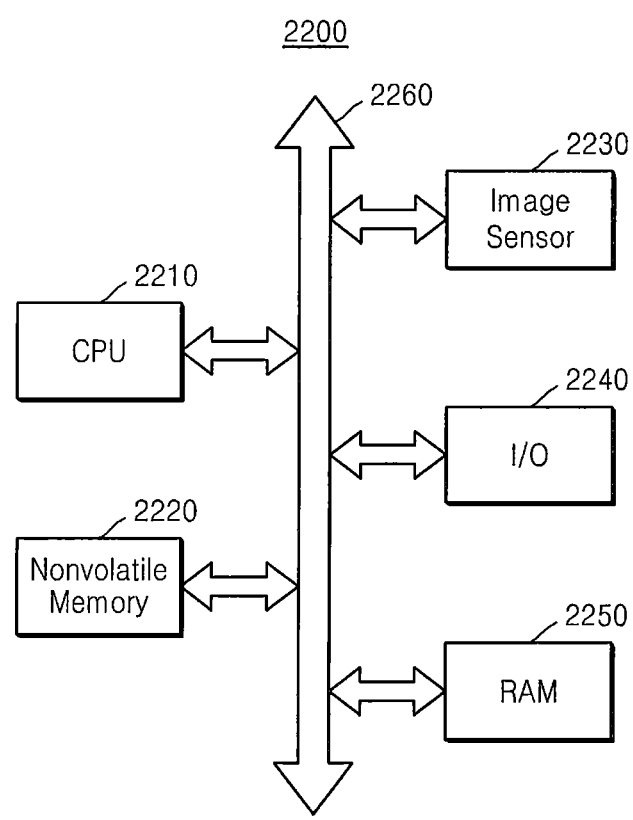
FIG. 12 is a block diagram of a system including the image sensor chip of FIG. 11.

FIG. 12 is a block diagram of a system 2200 including the image sensor chip 2100 of FIG. 11. The system 2200 may be one of a computing system, a camera system, a scanner, a car navigation system, a video phone, a security system, and a motion detection system requiring image data.

As shown in FIG. 12, the system 2200 may include a central processing unit (CPU) (or a processor) 2210, a non-volatile memory 2220, an image sensor chip 2230, an input/output apparatus 2240, and a random access memory (RAM) 2250. The CPU 2210 may communicate with the non-volatile memory 2220, the image sensor chip 2230, the input/output apparatus 2240, and the RAM 2250 via a bus 2260. The image sensor chip 2230 may be realized as an independent semiconductor chip, or may be coupled to the CPU 2210 as one semiconductor chip. The image sensor chip 2230 included in the system 2200 of FIG. 12 may include the pixels described above according to the embodiments of the present inventive concept. That is, the image sensor chip 2230 includes the pixel array ARY including the sensing pixels SPx and the focusing pixels FPx shown in FIG. 1, and each of the focusing pixels FPx includes the shielding layer 140 in the planarization layer 130 between the semiconductor layer 110 and the color filter layer 150. Thus, the output voltage may be output accurately according to the phase difference of light even in the BSI image sensor.

Figure 13:
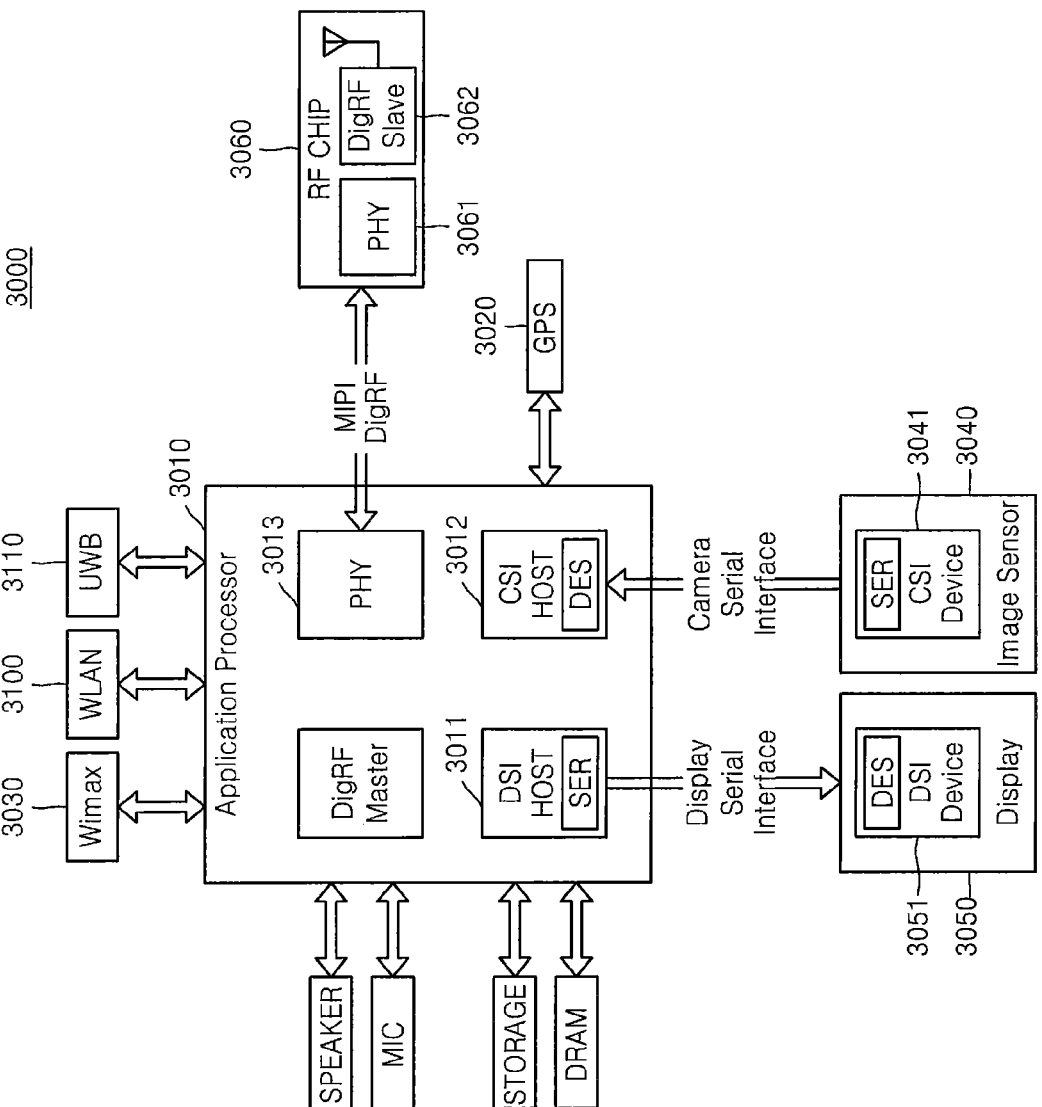
FIG. 13 is a diagram of an electronic system and an interface including an image sensor according to some embodiments of the present inventive concept.

FIG. 13 is a diagram of an electronic system including the image sensor and an interface according to some embodiments of the present inventive concept. Referring to FIG. 13, the electronic system 3000 may be realized as a data processing apparatus capable of using or supporting an interface using a mobile industry processor interface (MIPI), for example, a mobile phone, a personal digital assistant (PDA), a portable multimedia player (PMP), or a smartphone. The electronic system 3000 may include an application processor 3010, an image sensor chip 3040, and a display 3050.

A camera serial interface (CSI) host 3012 provided in the application processor 3010 may serially communicate with a CSI device 3041 of the image sensor 3040 via a CSI. Here, the CSI host 3012 may include a light deserializer, and the CSI device 3041 may include a light serializer. A display serial interface (DSI) host 3011 provided in the application processor 3010 may serially communicate with a DSI device 3051 of the display 3050 via a DSI. Here, the DSI host 3011 may include a light serializer, and the DSI device 3051 may include a light deserializer.

The electronic system 300 may further include a radio frequency (RF) chip 3060 that may communicate with the application processor 3010. A PHY 3013 of the electronic system 3000 and a PHY 3061 of the RF chip 3060 may transmit/receive data to/from each other according to MIPI DigRF. The electronic system 3000 may further include a global positioning system (GPS) device 3020, storage 3070, a microphone 3080, dynamic RAM (DRAM) 3085, and a speaker 3090, and the electronic system 3000 may perform communication by using Wimax 3030, a wireless local area network (WLAN) 3100, and an ultra wide band (UWB) 3110.

While the inventive concept has been particularly shown and described with reference to example embodiments thereof, it will be understood that various changes in form and details may be made therein without departing from the spirit and scope of the following claims.

What is claimed is:
1. An image sensor comprising:
a pixel array comprising:
a plurality of sensing pixels configured to output image signals respectively corresponding to intensities of incident light; and
at least two focusing pixels that are adjacent one another, and each outputting a phase difference of the incident light as a focusing signal;
wherein each of the at least two focusing pixels comprises:
a semiconductor layer including a photodetecting device accumulating electric charges generated according to absorbed light from among the incident light;
a wiring layer on a first surface of the semiconductor layer and including wirings;
a planarization layer on a second surface of the semiconductor layer and having a first surface;
a shielding layer in the planarization layer to block a portion of the incident light to be received by the photodetecting device; and
a color filter layer and a micro lens layer on a second surface of the planarization layer that is opposite the first surface of the planarization layer,
wherein the color filter layer is configured to selectively transmit the incident light according to a wavelength of the incident light and the micro lens layer is configured to selectively focus the incident light onto the photodetecting device, and
wherein the shielding layer is in the planarization layer in contact with the first surface of the planarization layer or the second surface of the planarization layer.

2. The image sensor of claim 1, wherein the shielding layer comprises metal.

3. The image sensor of claim 1, wherein the shielding layer is in the planarization layer apart from the first and second surfaces of the planarization layer.

4. The image sensor of claim 1, wherein the pixel array includes a Bayer pattern, and the at least two focusing pixels are formed on a red (R) region or a blue (B) region of the Bayer pattern.

5. The image sensor of claim 4, wherein the shielding layers respectively comprised in the at least two focusing pixels are adjacent one another in a first direction.

6. The image sensor of claim 4, wherein the shielding layers respectively comprised in the at least two focusing pixels are adjacent one another in a second direction that is perpendicular to a first direction.

7. The image sensor of claim 4, wherein the shielding layers respectively comprised in the at least two focusing pixels are spaced apart from one another in a first direction.

8. The image sensor of claim 4, wherein the shielding layers respectively comprised in the at least two focusing pixels are spaced apart from one another in a second direction that is perpendicular to a first direction.

9. The image sensor of claim 1, further comprising:
a row driver configured to apply a row signal to the pixel array; and
a pixel signal processing unit configured to receive an image signal and/or a focusing signal from sensing pixels among the plurality of sensing pixels and/or focusing pixels among the plurality of focusing pixels that are activated by the row signal and processing the image signal or the focusing signal.

10. The image sensor of claim 9, wherein the pixel signal processing unit comprises:
a storage unit configured to store location information representing locations of the at least two focusing pixels; and
a comparison unit for comparing output voltages output from the at least two focusing pixels based on the location information, and processing a comparison result as the focusing signal.

11. The image sensor of claim 1, wherein the image sensor is configured as a chip.

12. An image capturing apparatus comprising:
a lens that focuses light reflected from a subject; and
an image sensor of a backside illumination (BSI) type that outputs an electrical signal corresponding to the light incident to the lens and comprises a pixel array comprising a plurality of pixels, each having a wiring layer that is located on a lower surface of a semiconductor layer including a photodetecting device and in an incident direction of the light,
wherein the pixel array comprised in the image sensor of the BSI type comprises:
a plurality of sensing pixels configured to output image signals respectively corresponding to intensities of incident light; and
at least two focusing pixels that are adjacent one another, each outputting a phase difference of the incident light as a focusing signal, and including a shielding layer that blocks a portion of incident light to be incident to the photodetecting device in order to detect a phase difference of the incident light on an upper surface of the semiconductor layer,
wherein each of the at least two focusing pixels comprises a planarization layer on a surface of the semiconductor layer and having a first surface on the surface of the semiconductor layer, and
wherein the shielding layer is in the planarization layer apart from the first surface of the planarization layer.

13. The image sensor of claim 12, wherein the shielding layer comprises metal.

14. The image sensor of claim 12, wherein the shielding layer is formed to have a cross-sectional area that is less than a cross-sectional area of each of the at least two focusing pixels, and wherein the planarization layer compensates for a step generated due to the shielding layer.

15. An image sensor comprising:
a pixel array including a plurality of sensing pixels configured to output image signals respectively corresponding to intensities of incident light and at least two focusing pixels that are adjacent one another and are each configured to output a phase difference of the incident light as a focusing signal,
wherein each of the at least two focusing pixels comprises:
a semiconductor layer including a photodetecting device accumulating electric charges generated according to absorbed light from among the incident light;
a planarization layer on a surface of the semiconductor layer and having a first surface on the surface of the semiconductor layer;
a shielding layer in the planarization layer to block a portion of the incident light to be received by the photodetecting device; and
a color filter layer on a second surface of the planarization layer,
wherein the color filter layer is configured to selectively transmit the incident light according to a wavelength of the incident light,
wherein the at least two focusing pixels comprise a first focusing pixel, a second focusing pixel, a third focusing pixel and a fourth focusing pixel,
wherein the first focusing pixel is adjacent the second focusing pixel and the third focusing pixel is adjacent the fourth focusing pixel,
wherein the shielding layers respectively comprised in the first and second focusing pixels are spaced apart from one another in a first direction, and
wherein the shielding layers respectively comprised in the third and fourth focusing pixels are spaced apart from one another in a second direction that is substantially perpendicular to the first direction.

16. The image sensor of claim 15, wherein a portion of the planarization layer is between the shielding layer and the semiconductor layer.

17. The image sensor of claim 15, wherein the pixel array includes a Bayer pattern, and the at least two focusing pixels are formed on a red (R) region or a blue (B) region of the Bayer pattern.

18. The image sensor of claim 15,
wherein the at least two focusing pixels comprise a first focusing pixel, a second focusing pixel, a third focusing pixel and a fourth focusing pixel,
wherein the first focusing pixel is adjacent the second focusing pixel and the third focusing pixel is adjacent the fourth focusing pixel,
wherein the shielding layers respectively comprised in the first and second focusing pixels are adjacent one another in a first direction, and
wherein the shielding layers respectively comprised in the third and fourth focusing pixels are adjacent one another in a second direction that is substantially perpendicular to the first direction.

* * * * *